United States Patent
Lee

(10) Patent No.: US 6,624,004 B2
(45) Date of Patent: Sep. 23, 2003

(54) FLIP CHIP INTERCONNECTED STRUCTURE AND A FABRICATION METHOD THEREOF

(75) Inventor: Shih-Chang Lee, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 10/177,898

(22) Filed: Jun. 20, 2002

(65) Prior Publication Data

US 2002/0153617 A1 Oct. 24, 2002

Related U.S. Application Data

(62) Division of application No. 09/895,554, filed on Jun. 28, 2001.

(30) Foreign Application Priority Data

Apr. 20, 2001 (TW) ......................... 90109499 A

(51) Int. Cl.⁷ .................. H01L 21/44; H01L 21/48; H01L 21/50
(52) U.S. Cl. ..................................... 438/107
(58) Field of Search ................ 438/107; 361/771, 361/760, 768, 774, 783; 174/260, 263, 265; 228/180.22; 257/738, 772, 774; 29/852, 840

(56) References Cited

U.S. PATENT DOCUMENTS

| | | | | |
|---|---|---|---|---|
| 3,871,015 A | * | 3/1975 | Lin et al. | 257/779 |
| 5,569,960 A | * | 10/1996 | Kumazawa et al. | 257/738 |
| 5,620,927 A | * | 4/1997 | Lee | 29/841 |
| 5,930,889 A | * | 8/1999 | Klein | 29/840 |
| 6,030,889 A | * | 2/2000 | Aulicino et al. | 438/613 |
| 6,117,759 A | * | 9/2000 | Greer et al. | 438/616 |
| 6,190,940 B1 | * | 2/2001 | DeFelice et al. | 438/106 |
| 6,255,142 B1 | * | 7/2001 | Babiarz et al. | 438/126 |
| 6,297,559 B1 | * | 10/2001 | Call et al. | 257/778 |
| 6,316,289 B1 | * | 11/2001 | Chung | 438/118 |
| 6,335,271 B1 | * | 1/2002 | Fukuyama | 438/616 |
| 6,365,976 B1 | * | 4/2002 | Carter et al. | 257/779 |
| 6,518,163 B2 | * | 2/2003 | Sakuyama et al. | 438/613 |
| 2001/0008310 A1 | * | 7/2001 | Sakuyama et al. | 257/737 |
| 2002/0068381 A1 | * | 6/2002 | Ference et al. | 438/108 |
| 2002/0185735 A1 | * | 12/2002 | Sakurai et al. | 257/737 |

* cited by examiner

*Primary Examiner*—Richard Elms
*Assistant Examiner*—Michael Luhrs
(74) *Attorney, Agent, or Firm*—J. C. Patents

(57) ABSTRACT

A flip chip interconnected structure comprises a chip having an active surface in which a plurality of bonding pads are formed on the active surface of the chip. A substrate has a surface and a chip locating region. The chip locating region is on the surface of the substrate and a plurality of nodes are formed on the chip locating region. A plurality of solder balls are respectively connected to the bonding pads and the nodes. The solder balls have various sizes. The chip is bonded to the chip locating region of the substrate by the solder balls.

14 Claims, 6 Drawing Sheets

FLIP CHIP INTERCONNECTED STRUCTURE AND A FABRICATION METHOD THEREOF

CROSS-REFERENCE TO RELATED APPLICATION

This application is a divisional application of, and claims the priority benefit of, U.S. application Ser. No. 09/895,554 filed on Jun. 28, 2001.

BACKGROUND OF THE INVENTION

1. Field of Invention

The present invention relates generally to a flip chip interconnected structure and a fabrication method thereof. More particularly, the present invention relates to an improved flip chip interconnected structure having good electrical connection and a fabrication method thereof.

2. Description of the Related Art

With the increasing need for high-density devices for use in lightweight, portable electronics, there has been a gradual shift in sizes of integrated circuits and their package configurations. This gradual shift has resulted in developing various techniques for different package types.

A flip chip interconnected technology utilizes solder bumps on bonding pads of a chip to electrically connect to a substrate. Comparing the flip chip interconnected method to a wire bonding method and a tape automatic bonding method, the circular path of the flip chip interconnected package is shorter and the electrical properties are better. The bumps are arranged in a matrix shape; thus, the amount of pin outs of the chip is significantly increased. Since the flip chip technique is faster, denser, thinner, lighter and provides a low cost package, one can expect the flip chip technique to replace wire bonding.

FIGS. 1 and 2 illustrate schematic views of a conventional flip chip package. Referring to FIG. 1, a chip 110 has an active surface 112, and a plurality of bonding pads 114 are arranged on the active surface 112. A plurality of bumps 116 are formed on the bonding pads 114 of the chip 110. A substrate 120 has a surface 122, and a plurality of nodes 124 are formed on the surface 122. A position of each node 124 corresponds to a position of each bump 116. A stencil printing process is carried out to apply solder paste onto the substrate 120. A plurality of solder structures 130 are formed on the nodes 124 of the substrate 120. Referring to FIGS. 1 and 2, a bonding process is performed to bond the chip 110 to the substrate 120. The bumps 116 of the chip 110 are bonded to the solder structures 130 of the substrate 120 in a reflow oven. A reflow method allows the bumps 116 to combine with the solder structures 130 to form a plurality of solder balls 140. The chip 110 is electrically connected to the substrate 120 by the solder balls 140.

Referring to FIG. 2, a filling process is carried out to fill a gap between the chip 110 and the substrate 120 with a molding compound 150, and the molding compound 150 encapsulates the solder balls 140.

However, in the reflow process, the substrate 120 will bend due to the heating in the reflow process. The distance between the chip 110 and the substrate 120 at a center region is closer due to the bending effect, and the distance between the chip 110 and the substrate 120 at the end regions is greater. Stress caused by the bending effect can affect the bonding between the chip 110 and the substrate 120. The solder balls 140 will easily detach from the nodes 124, and the stress due to the bending can also affect the reliability of the device. Thus the electrical connection and the reliability of the product are affected.

A conventional method utilizes a clamp (not shown) to hold the chip 110 and pre-heat the chip 110 for a while during a bonding process. Once the heat is transferred to the bumps 116, the bumps 116 will combine with the solder structures 130 to form the solder balls 140. Thus the chip 110 is electrically connected to the substrate 120. Although this method can prevent the substrate from bending, the pre-heating process on the chip 110 can damage the chip 110 because the chip is pre-heated for about 20 to 30 seconds at a temperature of about 200°. The conventional method complicates the fabrication process and the quality of the product is not reliable.

SUMMARY OF THE INVENTION

To achieve the foregoing and other objects and in accordance with the purpose of the present invention, the present invention provides a flip chip interconnected structure comprising a substrate having a surface, a chip locating region and a plurality of nodes. The chip locating region is on the surface of the substrate and the nodes are formed on the chip locating region. A chip is provided and has an active surface, on which a plurality of bonding pads are formed. The active surface of the chip corresponds to the surface of the substrate. A plurality of solder balls are respectively connected to the bonding pads and the nodes, wherein sizes of the solder balls are varied to allow the chip to bond to the chip locating region of the substrate. A molding compound is filled in between the chip and the substrate and is used to encapsulate the solder balls. The solder balls are arranged in a matrix, and sizes of the solder balls located at a center region of the chip locating region are smaller than sizes of the solder balls located at a peripheral region of the chip locating region.

It is another object of the present invention to provide a flip chip interconnected structure comprising a chip that has an active surface on which a plurality of bonding pads are formed. A substrate also is provided and has a surface, a chip locating region and a plurality of nodes. The chip locating region is on the surface of the substrate and the nodes are formed on the chip locating region. The chip locating region further comprises solder mask openings, and the nodes are exposed by the solder mask openings. Sizes of the solder mask openings are varied. A plurality of solder balls are respectively connected to the bonding pads and the nodes. The chip is bonded to the chip locating region of the substrate by the solder balls. The active surface of the chip corresponds to the surface of the substrate. A molding compound is filled in between the chip and the substrate and is used to encapsulate the solder balls. The solder mask openings are arranged in a matrix, and sizes of the solder mask openings located at a center region of the chip locating region are larger than sizes of the solder mask openings located at a peripheral region of the chip locating region.

It is another object of the present invention to provide a method of fabricating a flip chip interconnected structure. The steps of the method comprise first providing a chip that has an active surface. A plurality of bonding pads are formed on the active surface, and a plurality of bumps are formed on the bonding pads. A substrate is provided, which has a surface and a chip locating region. The chip locating region is on the surface of the substrate, and a plurality of nodes are formed on the chip locating region. Solder paste is used to cover the chip locating region and the nodes. The solder paste forms a plurality of solder structures with various sizes. A bonding process is performed to bond the active surface of the chip to the surface of the substrate by bonding the bumps to the solder structures. A heating process is carried out to combine the bumps and solder structures to form a plurality of solder balls. The solder balls are bonded respectively to the bonding pads and the nodes. The chip is bonded to the chip locating region of the substrate through the solder balls. A stencil printing board has a plurality of openings. The stencil printing board is located on the substrate and the nodes are exposed by the openings. The openings are filled with the solder paste by a screen printing method. Positions of the solder paste correspond to positions of the nodes. The solder paste forms solder structures with various sizes because the sizes of the openings are different. The openings are arranged in a matrix, and sizes of the openings located at a peripheral region of the stencil printing board are larger than sizes of the openings near a center region of the stencil printing board. Therefore, the amount of solder paste filled in the opening at the peripheral region is more than the amount of solder paste filled in the openings at the center region.

It is another object of the present invention to provide a method of fabricating a flip chip interconnected structure. The steps of the method comprise first providing a chip having an active surface. A plurality of bonding pads are formed on the active surface, and a plurality of bumps are formed on the bonding pads. A substrate having a surface is provided, wherein a chip locating region is on the surface. A solder mask layer and a plurality of nodes are formed on the chip locating region. A plurality of solder mask openings are formed on the solder mask layer, and the nodes are exposed by the solder mask openings, wherein the solder mask openings have various sizes. Solder paste is used to cover the chip locating region and the nodes. A bonding process is performed to bond the active surface of the chip to the surface of the substrate by bonding the bumps to the solder paste. A heating process is carried out to combine the bumps and solder paste to form a plurality of solder balls. The solder balls are bonded respectively to the bonding pads and the nodes. The chip is bonded to the chip locating region of the substrate through the solder balls. Sizes of the solder mask openings located at a center region of the chip locating region are larger than sizes of the solder mask openings located at a peripheral region of the chip locating region.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
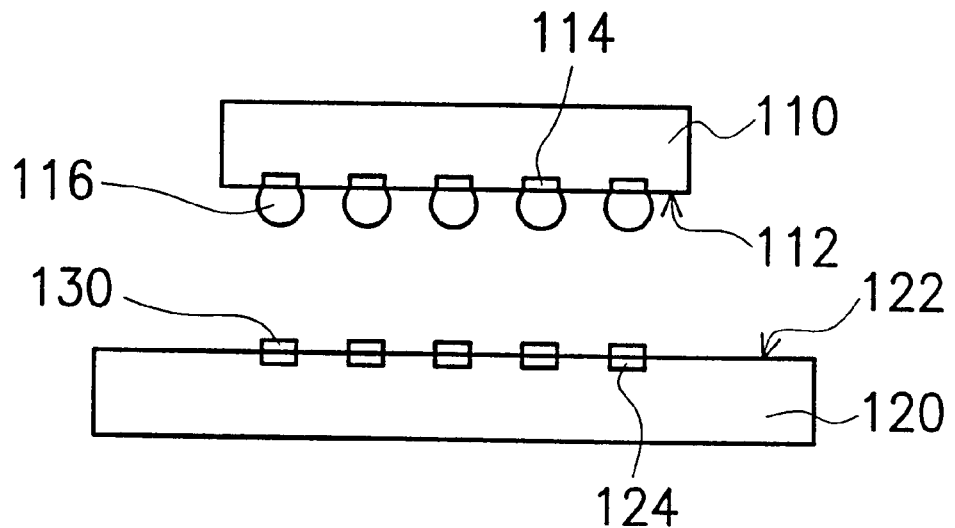
FIGS. 1 and 2 are schematic views of a conventional flip chip package.
Figure 2:
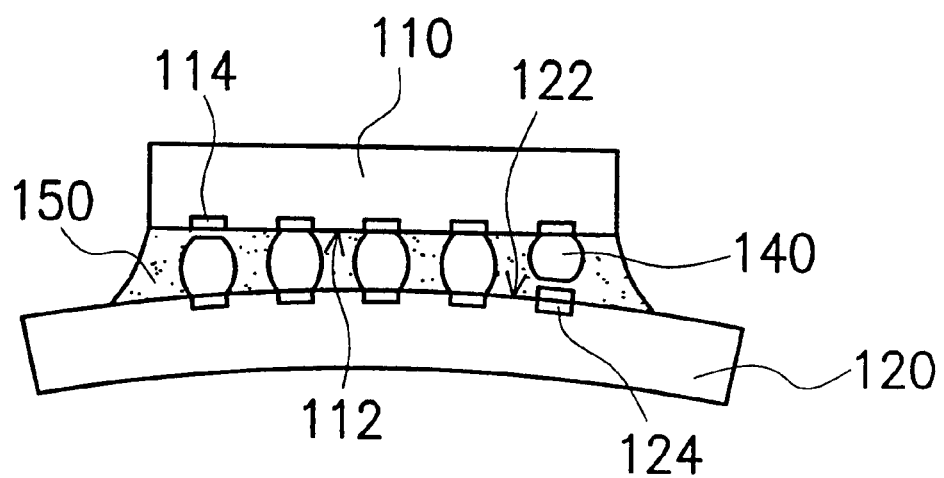
Figure 3:
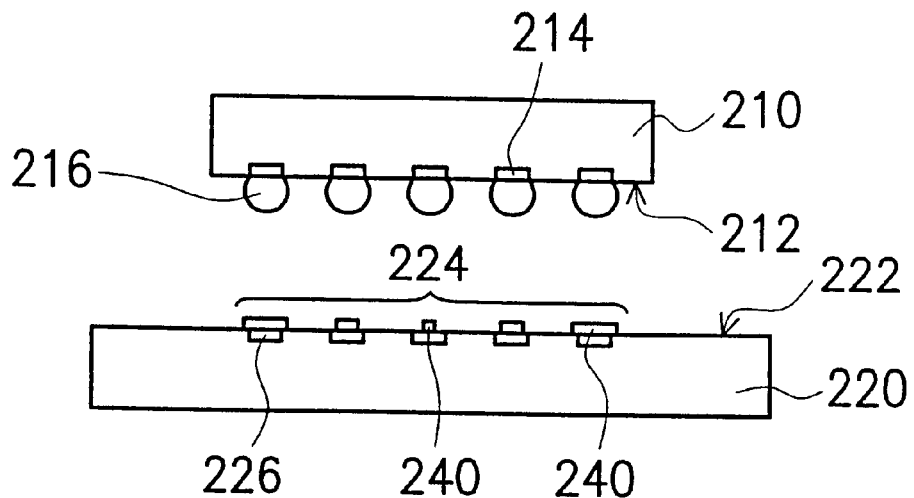
FIG. 3 is a schematic view of a flip chip interconnected structure in accordance with a preferred embodiment of the present invention.

FIG. 3 illustrates a schematic view of a flip chip interconnected structure in accordance with a preferred embodiment of the present invention. Referring to FIG. 3, a chip comprises an active surface 212. A plurality of bonding pads 214, which are formed on the active surface 212 have a plurality of bumps 216. A substrate 220 comprises a surface 222 and a chip locating region 224 on which a chip is located. A plurality of nodes 226 are formed on the chip locating region 224.

Figure 3A:
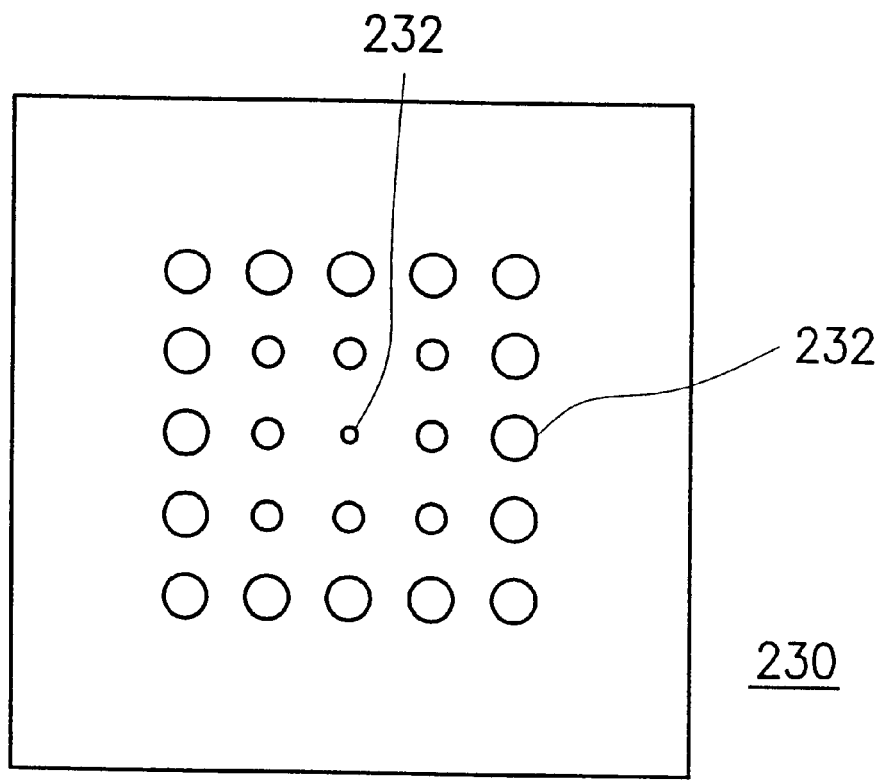
FIG. 3A is a schematic top view of a stencil printing board.

FIG. 3A illustrates a schematic top view of a stencil printing board. Referring to FIG. 3A, a stencil printing board 230 has a plurality of openings 232. The stencil printing board 230 is located on a substrate 220, and the nodes 226, which are located at the chip locating region 224, are exposed by the openings 232. The openings 232 are filled with solder paste by a screen printing method. When the screen printing process is carried out, the stencil printing board 230 is removed and the solder paste 240 located in the openings are remained on the surface 222 of the substrate. Positions of the solder paste 240 correspond to positions of the nodes 226. The openings 232 are arranged in a matrix shape, and sizes of the openings 232 located at a peripheral region of the stencil printing board 230 are larger than sizes of the openings near a center region of the stencil printing board 230. Therefore, the amount of solder paste filled in the opening 232 at the peripheral region is more than the amount of solder paste filled in the openings 232 at the center region.

Figure 4:
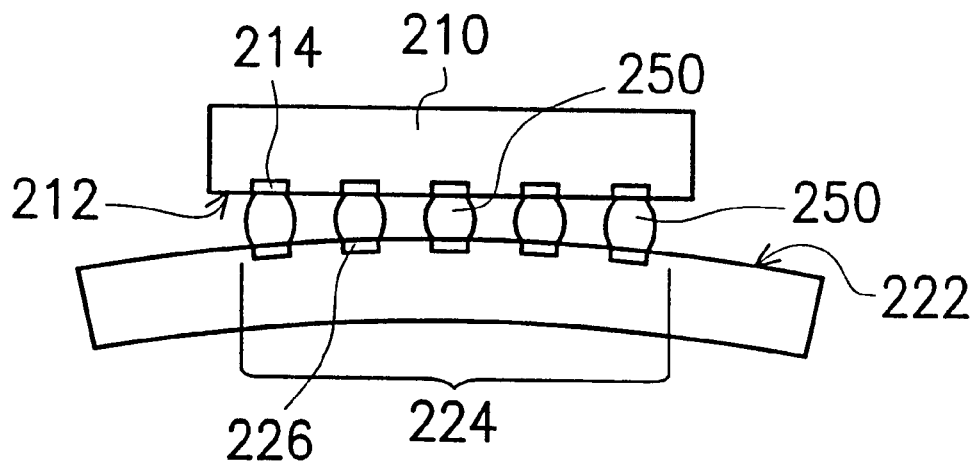
FIG. 4 is a cross-sectional view of a flip chip interconnected structure in accordance with a preferred embodiment of the present invention.

FIG. 4 illustrates a cross-sectional view of a flip chip interconnected structure in accordance with a preferred embodiment of the present invention. Referring to FIGS. 3 and 4, a bonding process is carried out to bond the active surface 212 of the chip 210 to the surface of the substrate 222. A reflow process is utilized to bond the bumps 216 to the solder paste 240 into solder balls 250, which are bonded to the bonding pads 214 and the nodes 226. The active surface 212 of the chip 210 is bonded onto the surface of chip locating region 224 by the solder balls 250. Since the sizes of the openings 232 are larger at the peripheral region than at the center region, sizes of solder balls 250 are larger at a peripheral region of the chip locating region 224 than at a center region of the chip locating region 224.

Figure 4A:
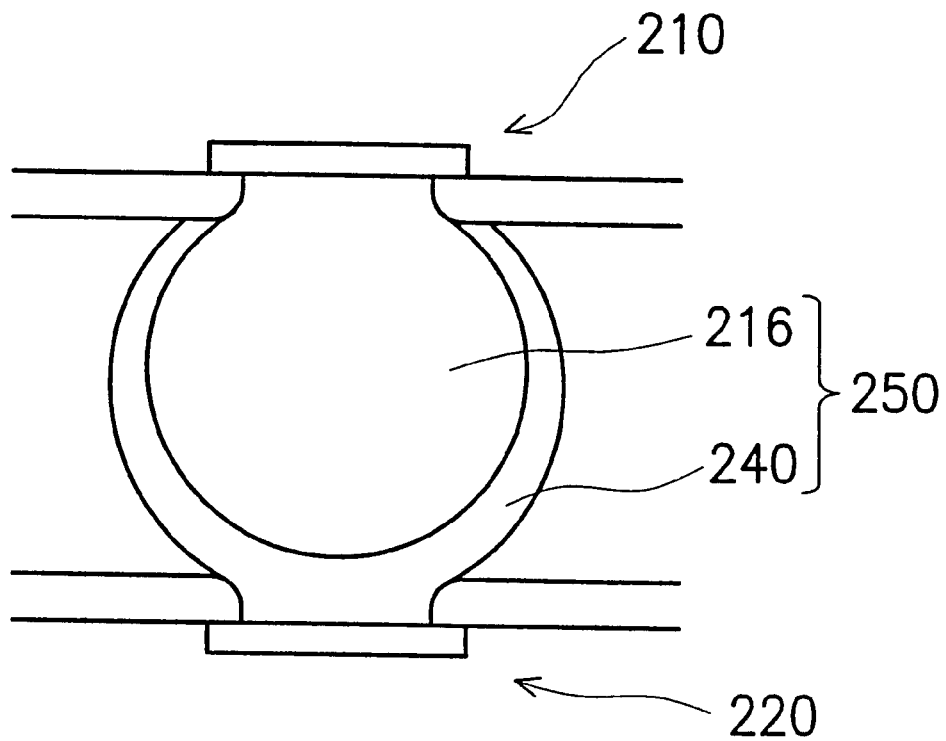
FIG. 4A is a schematic magnified view of a solder ball in accordance with a preferred embodiment of the present invention.

FIG. 4A illustrates a schematic magnified view of a solder ball in accordance with a preferred embodiment of the present invention. Referring to FIG. 4A, the bumps 216 are made of a material such as a tin/lead alloy with a ratio of about 5/95 and an eutectic point of approximately 312°. The solder paste 240 is made of a material such as a tin/lead alloy with a ratio of about 63/37 and an eutectic point of approximately 183°. During the reflow process, a temperature in a reflow oven (not shown) is about 200°. Therefore the bumps 216 will not melt but the solder paste 240 will melt and cover the periphery of the bumps 216 to form the solder balls 250. Thus, the chip 210 is bonded to the substrate 220.

Figure 5:
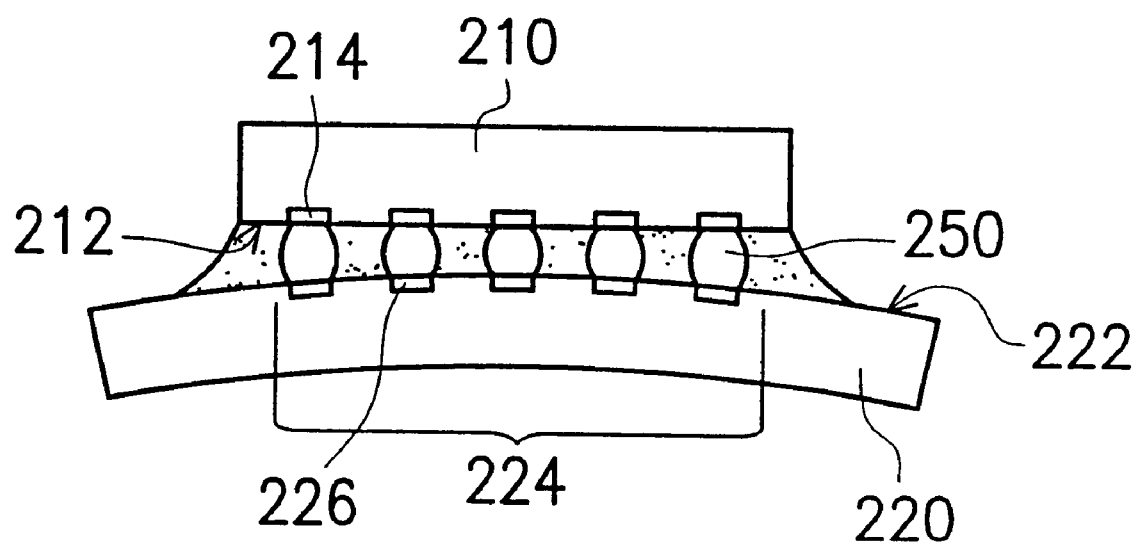
FIG. 5 is a cross-sectional view of a flip chip interconnected structure in accordance with a preferred embodiment of the present invention.

FIG. 5 illustrates a cross-sectional view of a flip chip interconnected structure in accordance with a preferred embodiment of the present invention. Referring to FIG. 5, a molding process is performed to encapsulate a gap between the active surface 212 of the chip 210 and the chip locating region 224 of the substrate 222 with an encapsulating material including a molding compound 260. The molding compound 260 encapsulates the solder balls 250.

From the above-mentioned fabrication of a flip chip, the substrate 220 will bend after the reflow process, and a deformation will occur. Therefore, a gap at a center region of the chip 210 and the chip locating region 224 is smaller than a gap at the ends of the chip 210 and the chip locating region 224. However, the openings 232 of the screen printing board 230 of the present invention are designed in such a way that the sizes of the openings 232 are larger at the peripheral region than at the center region. Thus, the sizes of solder balls 250 are larger at a peripheral region of the chip locating region 224 than at a center region of the chip locating region 224. The bonding between the chip 210 and the substrate 220 is much stronger at the peripheral region than at the center region. Therefore, even though bending of the substrate occurs, the bending effect does not affect the chip and the substrate. The electrical connection and the reliability between the chip 210 and the substrate 220 are improved.

Figure 6:
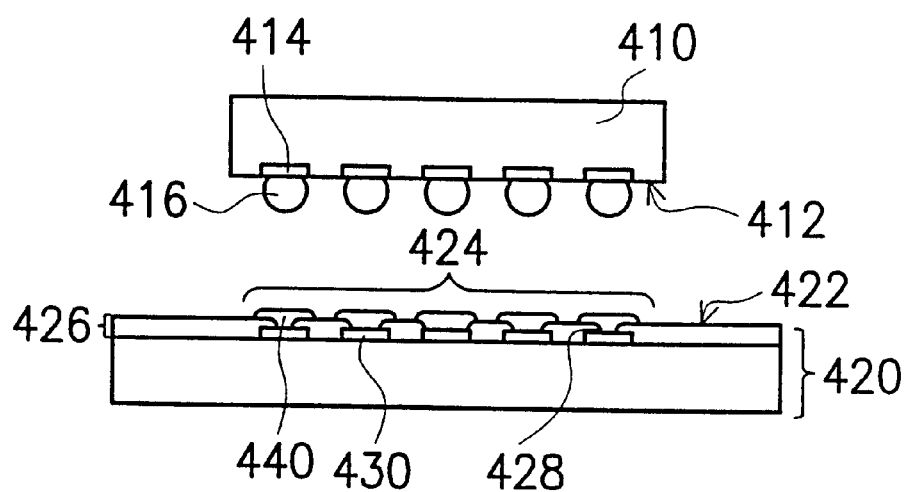
FIGS. 6, 7 and 8 are schematic cross-sectional views of a flip chip interconnected structure in accordance with another preferred embodiment of the present invention.
Figure 6A:
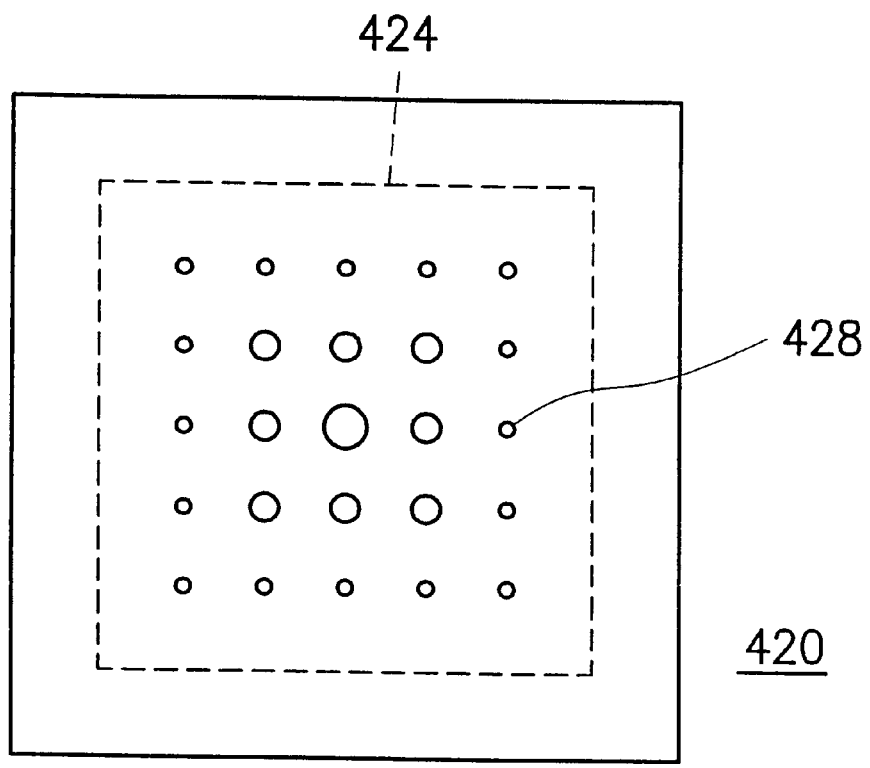
FIG. 6A is a schematic top view of solder mask openings on a substrate.
Figure 7:
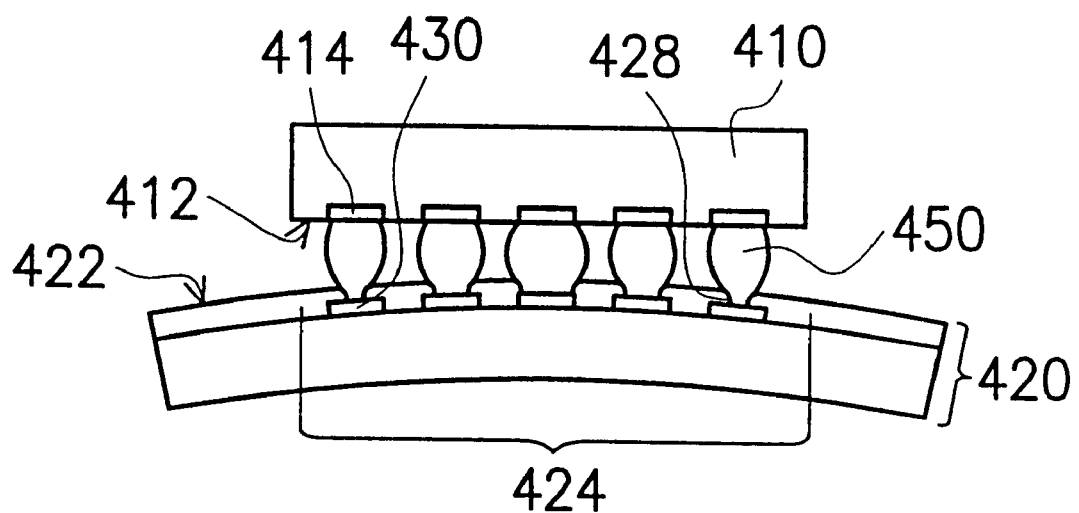
Figure 8:
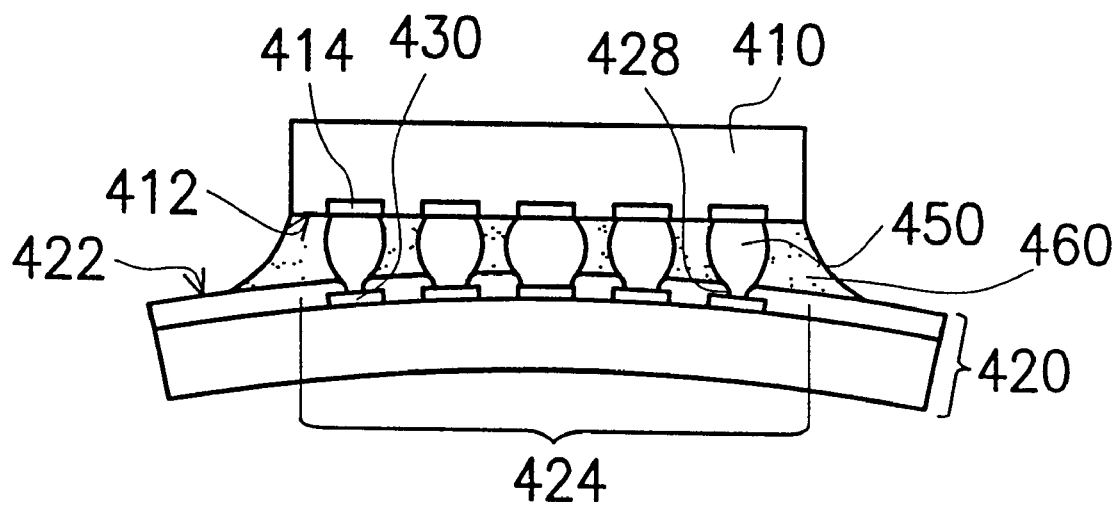

However, the present invention is not limited to the above-mentioned fabrication method and structure. FIGS. 6, 7 and 8 illustrate schematic cross-sectional views of a flip chip interconnected structure in accordance with another preferred embodiment of the present invention. A chip 410, which is provided, has an active surface 412. A plurality of bonding pads 414 are formed on the active surface 412 of the chip 410. Bumps 416 are formed on the bonding pads 414. FIG. 6A illustrates a schematic top view of solder mask openings on a substrate. Referring to FIGS. 6 and 6A, a substrate 420 has a surface 422. The surface 422 of the substrate 420 has a chip locating region 424. A solder mask layer 426 is formed on the surface 422 of the substrate 420. A plurality of solder mask openings 428 are formed in the solder mask layer 426 and each opening 428 exposes a node 430. The solder mask openings 428 are arranged in a matrix shaped, and sizes of the solder mask openings 428 located at a center region of the chip locating region 424 are larger than sizes of the solder mask openings 428 located at a peripheral region of the chip locating region 424.

Referring to FIG. 6, the solder mask openings 428 are filled with solder paste by a screen printing method, wherein the formation of the solder paste 440 corresponds to locations of the nodes 430 of the chip locating region 424.

FIG. 7 illustrates a schematic cross-sectional view of a flip chip interconnected structure in accordance with another preferred embodiment of the present invention. Referring to FIGS. 6 and 7, a bonding process is carried out to bond the active surface 412 of the chip 410 to the surface 422 of the substrate 420. The bumps 416 are bonded to the solder paste 440 and a reflow process is performed to combine the bumps 416 with the solder paste 440 to form a plurality of solder balls 450. The solder balls 450 are respectively bonded to the bonding pads 414 and the nodes 430. The sizes of the solder mask openings 428 located at the center region of the chip locating region 424 are larger than the sizes of the solder mask openings 428 located at the peripheral region of the chip locating region 424. Thus, during the bonding process, bending occurs at edges of the substrate 420. Due to the stress of the bending of the substrate 420, the solder balls 450 at the peripheral region of the chip locating region 424 will form into a cylindrical shape. However, the solder balls 450 at the center region of the chip locating region 424 will form into a circular shape. Therefore, the shapes of the solder balls 450 are varied along the chip location region according to the sizes of the solder mask openings 428.

Since the solder mask openings 428 have various sizes, the amount of the solder paste 440 in the solder mask openings 428 are different. By utilizing the different sizes of the solder mask openings 428 and the amount of the solder paste 440, the solder balls 450 are formed into various shapes; thus, the bonding between the chip 410 and the substrate 420 is improved to overcome the stress caused by the bending effect. Because the sizes of the solder mask openings 428 at the center region are larger than the sizes of the solder mask openings 428 at the peripheral region, after the formation of the solder balls 450, the solder balls located at the center region of the chip locating region 424 are shorter than the solder balls located at the peripheral region of the chip locating region 424.

From the above-mentioned, the substrate 420 will bend after the reflow process, and a deformation will occur. Therefore, a gap at a center region of the chip 410 and the chip locating region 424 is smaller than a gap at the ends of the chip 410 and the chip locating region 224. However, the solder mask openings 428 of the present invention are designed in such a way that the sizes of the solder mask openings 428 at the center region of the chip locating region 424 are larger than the solder mask openings 428 located at the peripheral region of the chip locating region 424. Thus, the present invention utilizes the various sizes of the solder mask openings 428 to control the sizes of the solder balls 250. As a matter of fact, the solder balls 450 at the center region of the chip locating region 424 are shorter than the solder balls 450 at the peripheral region of the chip locating region 424. Therefore, despite the stress caused by the bending effect, the bonding between the substrate 420 and the chip 410 is strong enough both at the peripheral region and the center region. Therefore, the gap along the chip locating region 424 varies, but shorter solder balls 450 at the center region and higher solder ball 450 at the peripheral region allow the substrate 420 to bond strongly to the chip 410. Thus, the bonding between the solder balls 450, the bonding pads 414 and the nodes 430 are significantly improved.

However, the present invention can combine the above-described methods in both embodiments to fabricate the flip chip interconnected structure, and the bonding effect between the solder balls, chip and the substrate can be significantly improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a flip chip interconnected structure, the steps of the method comprising:

providing a chip having an active surface, wherein a plurality of bonding pads are formed on the active surface, and a plurality of bumps are formed on the bonding pads;

providing a substrate having a first surface, wherein a chip locating region is on the first surface, and a plurality of nodes are formed on the chip locating region;

applying a solder paste to respectively cover the nodes of the chip locating region, wherein the solder paste forms a plurality of solder structures with different sizes according to the respective locations of the nodes on the chip locating region; and performing a bonding process, wherein the active surface of the chip is bonded to the surface of the substrate by bonding the bumps to the solder structures, and a heating process is carried out to combine the bumps and the solder structures to form a plurality of solder balls, wherein each solder ball is bonded respectively to one of the bonding pads and one of the nodes, and the chip is bonded to the chip locating region of the substrate through the solder balls.

2. The method of claim 1, wherein the bonding process further comprises an encapsulating process, wherein an encapsulating material is filled in between the chip and the substrate, and encapsulating the solder balls.

3. The method of claim 1, wherein the step of applying the solder paste further comprises:

providing a stencil printing board having a plurality of openings, wherein the stencil printing board is located on the substrate and the nodes of the chip locating region are exposed by the openings that have different sizes according to the locations of the nodes on the chip locating region; and filling the openings with the solder paste by a screen printing method, which thereby forms the solder structures with the different sizes according to the sizes of the openings.

4. The method of claim 3, wherein the openings are arranged in a matrix, and sizes of the openings located at a peripheral region of the stencil printing board are larger than sizes of the openings near a center region of the stencil printing board, thereby the amount of the solder paste filled in the opening at the peripheral region is more than the amount of the solder paste filled in the openings at the center region.

5. The method of claim 1, wherein the bonding process further comprises a reflow method to combine the bumps and the solder structures.

6. The method of claim 1, wherein the solder balls are arranged in a matrix, and sizes of the solder balls located at a center region of the chip locating region are smaller than sizes of the solder balls located at a peripheral region of the chip locating region.

7. The method of claim 1, wherein each solder ball is made of a tin/lead alloy containing a high percentage of lead.

8. A method of fabricating a flip chip interconnected structure, the steps of the method comprising:

providing a chip having an active surface, wherein a plurality of bonding pads are formed on the active surface, and a plurality of bumps are formed on the bonding pads;

providing a substrate having a first surface, wherein a chip locating region is on the first surface, and a solder mask layer and a plurality of nodes are formed on the chip locating region, wherein a plurality of solder mask openings having different sizes are formed on the solder mask layer, and the nodes are exposed by the solder mask openings;

applying a solder paste in the solder mask openings to respectively cover the nodes of the chip locating region; and performing a bonding process, wherein the active surface of the chip is bonded to the surface of the substrate by bonding the bumps to the solder paste, and a heating process is carried out to combine each bump and each solder paste to form a solder ball, wherein a plurality of solder balls are thereby formed and are bonded respectively to the bonding pads and the nodes, and the chip is bonded to the chip locating region of the substrate through the solder balls.

9. The method of claim 8, wherein the bonding process further comprises an encapsulating process, wherein an encapsulating material is filled in between the chip and the substrate, and encapsulating the solder balls.

10. The method of claim 8, wherein sizes of the solder mask openings located at a center region of the chip locating region are larger than sizes of the solder mask openings located at a peripheral region of the chip locating region.

11. The method of claim 8, wherein the bonding process further comprises a reflow method to combine the bumps and the solder structures.

12. A method of fabricating a flip chip interconnected structure, the steps of the method comprising:

providing a chip having an active surface, wherein a plurality of bonding pads are formed on the active surface, and a plurality of bumps are formed on the bonding pads;

providing a substrate having a first surface, wherein a plurality of nodes are formed on a chip locating region of the first surface, and a solder mask is formed on the chip locating region, the solder mask having a plurality of openings that respectively expose the nodes of the chip locating region, and the openings of the solder mask at a center region being different in size from the openings of the solder mask at a peripheral region;

filling a solder paste in the openings of the solder mask to cover the nodes of the chip locating region; and performing a bonding process, wherein the bumps of the chip are respectively bonded to the solder paste, and a heating process is carried out to combine each bump and the solder paste in each opening to form a solder ball, a plurality of solder balls are thereby formed and are bonded respectively to the bonding pads and the nodes, and the chip is bonded to the chip locating region of the substrate through the solder balls.

13. The method of claim 12, wherein the openings of the solder mask at the peripheral region are larger than the openings of the solder mask at the center region.

14. The method of claim 12, wherein the openings of the solder mask at the center region are larger than the openings of the solder mask at the peripheral region.

* * * * *